(12) United States Patent
Liebmann et al.

(10) Patent No.: US 11,217,583 B2
(45) Date of Patent: Jan. 4, 2022

(54) ARCHITECTURE DESIGN OF MONOLITHICALLY INTEGRATED 3D CMOS LOGIC AND MEMORY

(71) Applicant: Tokyo Electron Limited, Tokyo (JP)

(72) Inventors: Lars Liebmann, Mechanicville, NY (US); Jeffrey Smith, Clifton Park, NY (US); Anton J. deVilliers, Clifton Park, NY (US); Kandabara Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/560,490

(22) Filed: Sep. 4, 2019

(65) Prior Publication Data
US 2020/0075592 A1 Mar. 5, 2020

Related U.S. Application Data

(60) Provisional application No. 62/727,097, filed on Sep. 5, 2018.

(51) Int. Cl.
*H01L 27/092* (2006.01)
*H01L 29/423* (2006.01)
(Continued)

(52) U.S. Cl.
CPC ...... *H01L 27/092* (2013.01); *H01L 21/32139* (2013.01); *H01L 21/76895* (2013.01); *H01L 21/8221* (2013.01); *H01L 21/823828* (2013.01); *H01L 21/823871* (2013.01); *H01L 23/528* (2013.01); *H01L 23/535* (2013.01); *H01L 27/0207* (2013.01); *H01L 29/0847* (2013.01);
(Continued)

(58) Field of Classification Search
CPC combination set(s) only.
See application file for complete search history.

(56) References Cited

U.S. PATENT DOCUMENTS 8,564,050 B2  10/2013 Park et al.
9,355,913 B2   5/2016 Park et al.
(Continued)

FOREIGN PATENT DOCUMENTS

WO  WO 2017/053329 A1  3/2017

OTHER PUBLICATIONS

International Search Report and Written Opinion dated Dec. 24, 2019 in PCT/US2019/049348, 9 pages.

*Primary Examiner* — Jay C Chang
*Assistant Examiner* — Mikka Liu
(74) *Attorney, Agent, or Firm* — Oblon, McClelland, Maier & Neustadt, L.L.P.

(57) ABSTRACT

A semiconductor device is provided. The device includes a plurality of transistor pairs that are stacked over a substrate. Each of the plurality of transistor pairs includes a n-type transistor and a p-type transistor that are stacked over one another. The device also includes a plurality of gate electrodes that are stacked over the substrate with a staircase configuration. The plurality of gate electrodes are electrically coupled to gate structures of the plurality of transistor pairs. The device further includes a plurality of source/drain (S/D) local interconnects that are stacked over the substrate with a staircase configuration. The plurality of S/D local interconnects are electrically coupled to source regions and drain regions of the plurality of transistor pairs.

13 Claims, 16 Drawing Sheets

(51) Int. Cl.

| | |
|---|---|
| *H01L 23/535* | (2006.01) |
| *H01L 29/417* | (2006.01) |
| *H01L 23/528* | (2006.01) |
| *H01L 29/08* | (2006.01) |
| *H01L 21/3213* | (2006.01) |
| *H01L 21/822* | (2006.01) |
| *H01L 21/8238* | (2006.01) |
| *H01L 21/768* | (2006.01) |
| *H03K 19/0948* | (2006.01) |
| *H01L 27/02* | (2006.01) |
| *H01L 29/10* | (2006.01) |

(52) U.S. Cl.
CPC .... *H01L 29/1033* (2013.01); *H01L 29/41758* (2013.01); *H01L 29/42376* (2013.01); *H03K 19/0948* (2013.01)

(56) References Cited

U.S. PATENT DOCUMENTS

| | | |
|---|---|---|
| 9,449,987 B1 | 9/2016 | Miyata et al. |
| 9,543,318 B1 | 1/2017 | Lu et al. |
| 9,601,577 B1 | 3/2017 | Lee et al. |
| 9,882,026 B2 | 1/2018 | Tapily et al. |
| 9,911,745 B2 | 3/2018 | Lee et al. |
| 2012/0119287 A1 | 5/2012 | Park et al. |
| 2014/0038400 A1 | 2/2014 | Park et al. |
| 2016/0204228 A1* | 7/2016 | Tapily ............... H01L 29/42392 438/151 |
| 2017/0053906 A1* | 2/2017 | Or-Bach ........... H01L 27/11578 |
| 2017/0104068 A1 | 4/2017 | Lee et al. |
| 2017/0148804 A1 | 5/2017 | Lee et al. |
| 2018/0108577 A1* | 4/2018 | Zhu ................ H01L 21/823418 |
| 2018/0269229 A1 | 9/2018 | Or-Bach et al. |

* cited by examiner

ARCHITECTURE DESIGN OF MONOLITHICALLY INTEGRATED 3D CMOS LOGIC AND MEMORY

CROSS REFERENCE TO RELATED APPLICATIONS

This application claims the benefit of U.S. Provisional Application No. 62/727,097 filed on Sep. 5, 2018, the entire contents of which is incorporated herein by reference.

FIELD OF THE INVENTION

The disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Techniques herein provide cell architecture, design concept, and corresponding methods of manufacture for stacked complimentary FET (field effect transistor) devices. Complimentary FET devices (CFET) are three-dimensionally stacked logic standard cells in which either the NMOS or PMOS transistor is positioned overtop (vertically above) its compliment. Such a configuration enables an area-scaling and routing congestion improvement for logic standard cells as well as SRAM memory cells. 3D integration is a viable option to continue semiconductor scaling in spite of inevitable saturation in critical dimension scaling. As contacted gate pitch reaches its scaling limit due to manufacturing variability and electrostatic device limitations, two-dimensional transistor density scaling stops. Even experimental new transistor designs, such as vertical channel gate-all-around transistors, that might be able to one day overcome these contacted gate pitch scaling limits, do not promise to get semiconductor scaling back on track. This is because resistance, capacitance, and reliability concerns limit wire pitch scaling, thereby limiting the density with which transistors can be wired into circuits.

3D integration, i.e. the vertical stacking of multiple devices, aims to overcome these scaling limitations by increasing transistor density in volume rather than area. Conventional CMOS VLSI scaling, as used for example in CPU or GPU products, remains hesitant to adopt 3D integration as a primary means of moving the semiconductor roadmap forward. The primary reason for this lack of adoption of 3D integration for anything other than niche applications (e.g. memory stacked on top of logic for machine learning accelerators used in artificial intelligence chips) is the inherent inefficiency of known technologies.

Techniques herein improve the design and manufacturing efficiency of monolithically integrated 3D CMOS devices. Techniques include using a common device stack with which all CFET source (input), drain (output), and gate connections are wired to an array of contacts sitting just above a top CMOS level of the standard cell. A series of customization layers achieves a desired cell functionality with customized local wiring.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The device includes a plurality of transistor pairs that are stacked over a substrate, where each of the plurality of transistor pairs includes a n-type transistor and a p-type transistor that are stacked over one another. The device also includes a plurality of gate electrodes that are stacked over the substrate with a staircase configuration, where the plurality of gate electrodes are electrically coupled to gate structures of the plurality of transistor pairs. The device further includes a plurality of source/drain (S/D) local interconnects that are stacked over the substrate with a staircase configuration, where the plurality of S/D local interconnects are electrically coupled to source regions and drain regions of the plurality of transistor pairs.

In some embodiments, the n-type transistor is positioned over the p-type transistor so as to form a complementary field effect transistor (CFET) device. In some embodiments, the p-type transistor is positioned over the n-type transistor so as to form a complementary field effect transistor device. The n-type transistor and the p-type transistor can share a gate structure that is electrically coupled to one of the plurality of gate electrodes.

The device can include an array of vertical contacts that are positioned over the plurality of transistor pairs, formed in a direction perpendicular to the substrate and electrically coupled to the plurality of gate electrodes, and the plurality of S/D local interconnects.

In the disclosed device, a series of wiring levels are positioned over the array of vertical contacts and provide a functionality of the semiconductor device by connecting the array of vertical contacts.

The n-type transistor has a source region and a drain region that are positioned at two ends of a n-type channel region that is surrounded by the gate structure. The p-type transistor has a source region and a drain region that are positioned at two ends of the p-type channel region that is surrounded by the gate structure. Each of the plurality of S/D local interconnects is positioned over two sides of a respective gate electrode of the plurality of the gate electrodes.

According to another aspect of the disclosure, a method of forming a semiconductor is provided. In the disclosed method, a plurality of transistor pairs can be formed. The plurality of transistor pairs can be stacked over a substrate, where the plurality of transistor pairs have a plurality of gate electrodes that are stacked over the substrate and electrically coupled to gate structures of the plurality of transistor pairs, and a plurality of source/drain (S/D) local interconnects that are stacked over the substrate and electrically coupled to source regions and drain regions of the plurality of transistor pairs. Subsequently, a sequence of vertical and lateral etch steps can be performed to etch the plurality of the gate electrodes and the plurality of S/D local interconnects so that the plurality of the gate electrodes and the plurality of S/D local interconnects have a staircase configuration.

According to yet another aspect of the disclosure, a semiconductor device is provided. The device includes a plurality of transistor pairs that are stacked over a substrate, where the plurality of transistor pairs have a plurality of gate electrodes that are stacked over the substrate with a staircase configuration and electrically coupled to gate structures of the plurality of transistor pairs, and a plurality of source/drain (S/D) local interconnects that are stacked over the substrate with a staircase configuration and electrically coupled to source regions and drain regions of the plurality of transistor pairs. The device also includes an array of vertical contacts that are positioned over the plurality of transistor pairs, arranged in a direction perpendicular to the substrate and electrically coupled to the plurality of gate electrodes, and the plurality of S/D local interconnects. The device further includes a series of wiring levels that are positioned over the array of vertical contacts and provide a functionality of the semiconductor device by connecting the array of vertical contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
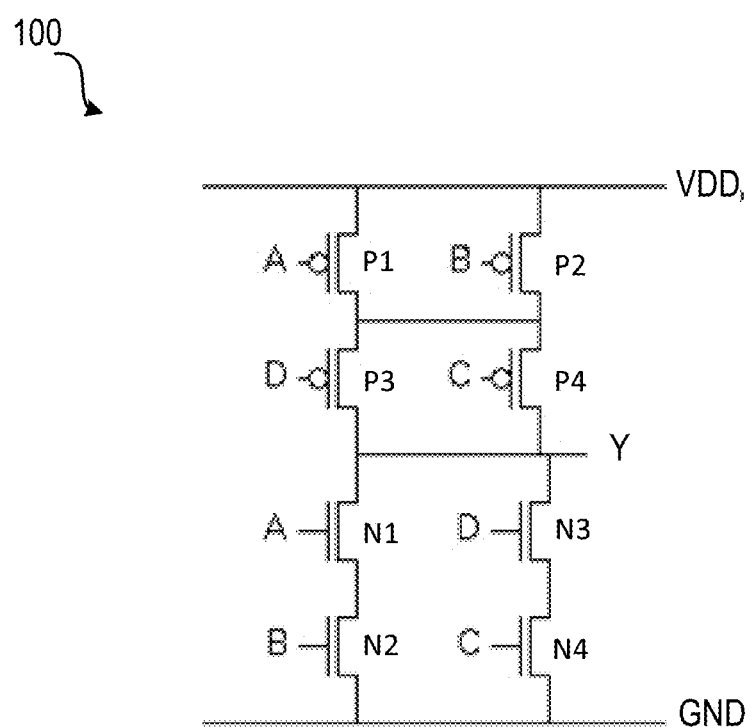
FIG. 1 is a schematic circuit diagram of an And-Or-Invert 22 (AOI22) cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein improve the design and manufacturing efficiency of monolithically integrated 3D CMOS devices. Techniques include using a generic (uniform or common) device stack with which all CFET source (input), drain (output), and gate connections are wired to an array of contacts sitting just above a top CMOS level of the standard cell. A series of customization layers achieves a desired cell functionality with customized local wiring.

A majority of logic chips are generated from logic primitives rendered in standard cells. One exemplary standard cell can be shown in FIG. 1. FIG. 1 illustrates a schematic circuit diagram of an And-Or-Invert (AOI) cell 100. The AOI cell 100 herein is a moderately complex standard cell with transistors that are grouped in parallel pairs on a p-fet side of the cell and serial pairs on a n-fet side of the CMOS circuit. For example, the p-fet side can includes four p-type transistors P1-P4, where P1 and P2 are connected in parallel, and P3 and P4 are connected in parallel. The n-fet side can includes four n-type transistors N1-N4, where N1 and N2 are serially connected and N3 and N4 are serially connected. The AOI cell 100 is electrically coupled to four inputs A-D and an output Y. Each of the four inputs A-D is coupled to a respective n-type gate and p-type gate of the AOI cell 100. For example, the input A is coupled to a n-type gate of n-type transistor N1 and a p-type gate of p-type transistor P1. In addition. The AOI cell 100 is connected to a supply voltage VDD that are coupled to source regions of the p-type transistors P1 and P2. The AOI cell 100 is further connected to a ground voltage GND (also referred to as VSS) that is coupled to source regions of the n-type transistors N2 and N4.

Figure 2:
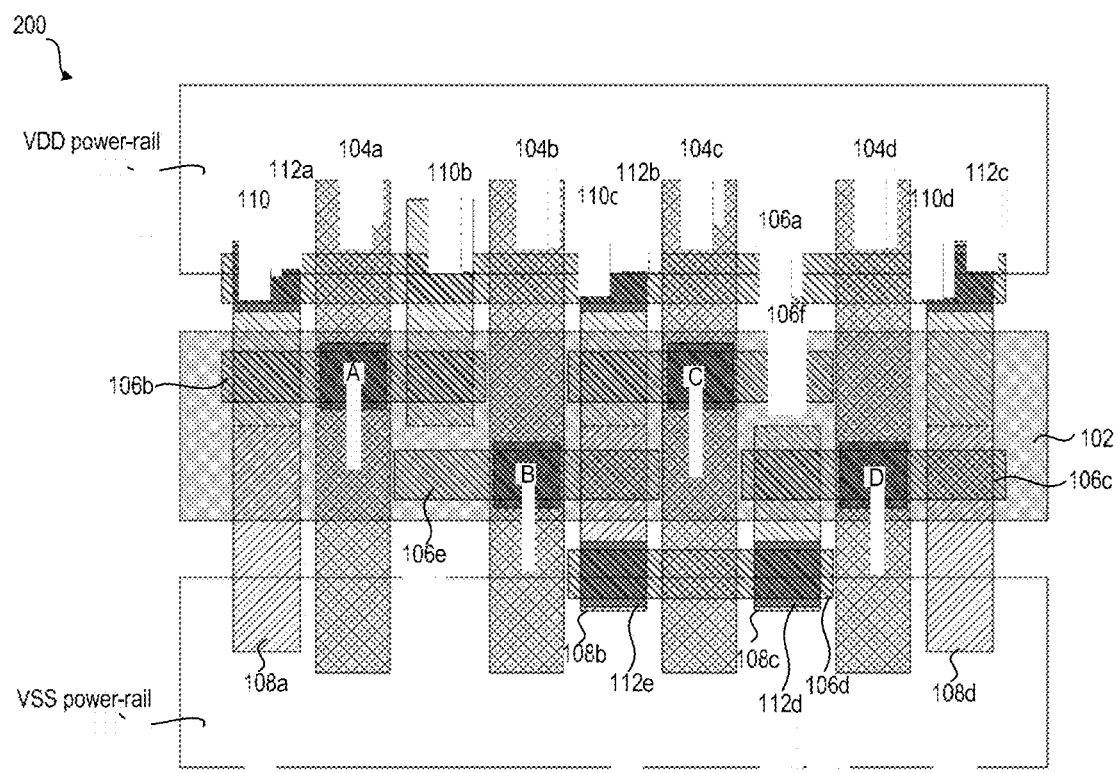
FIG. 2 is a top down layout view of a complementary field enhanced transistor (CFET) implementation of an AOI22 cell, in accordance with some embodiments.

FIG. 2 is an associated layout 200 for the AOI cell 100 that is formed based on a non-3D integrated CFET rendering. FIG. 2 illustrates a top down view of the layout 200 of the AOI cell 100. As shown in FIG. 2, the layout 200 can have an active region 102 that are doped through an ion implantation process. The layout 200 can have four gate structures 104a and 104b. The layout 200 also includes a plurality of lowest level of metal layer (e.g., M0) 106a-106f. The layout 200 can include a plurality of n-fet source/drain (S/D) local interconnects 108a-108d, and a plurality of p-fet source/drain (S/D) local interconnects 110a-110d. The n-fet source/drain (S/D) local interconnects 108 and the p-fet source/drain (S/D) local interconnects 110 are connected to the M0 106 through a plurality of contacts 112a-112e. In addition, the layout 200 can include a plurality of gate contacts A-D that are connected the gate structures 104 and the M0 to access the inputs A-D respectively. The power delivery under discussion herein is shown in the circuit schematic FIG. 1A, as VDD and GND (also referred to as VSS). In the top down view of the layout 200, the VDD and VSS power-rails are shown as wide bars at a top and a bottom horizontal edges of the layout 200. Power-taps (not shown) formed in the S/D local interconnects 108 and 110 are used to connect the transistors' source regions to these power-rails.

Figure 3:
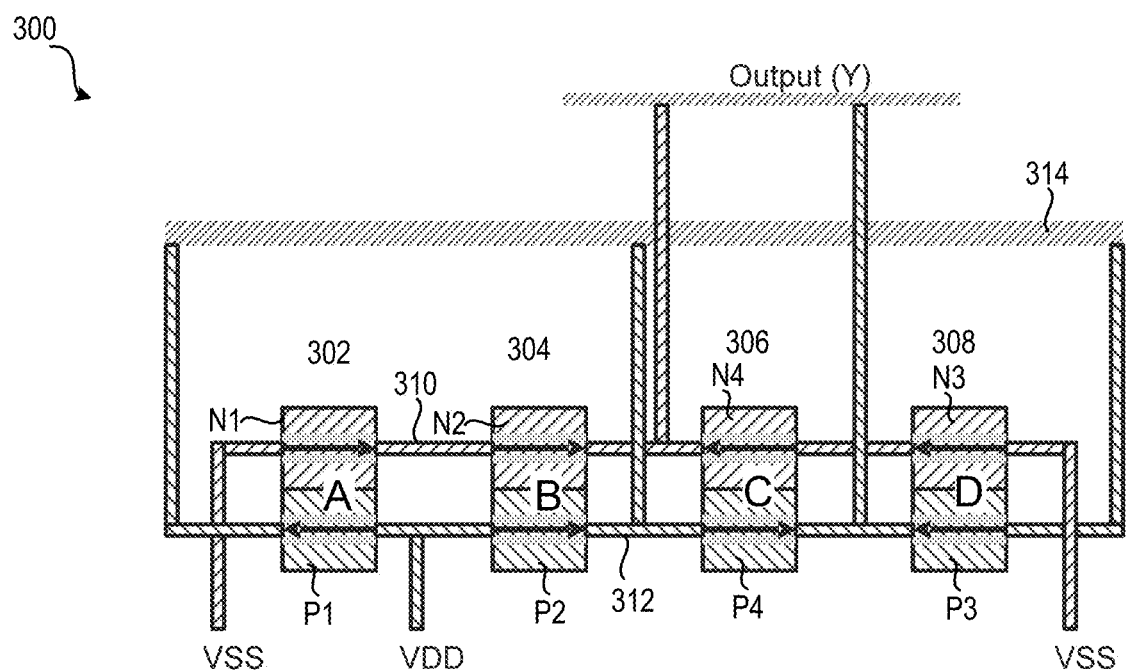
FIG. 3 is a schematic diagram of an AOI22 cell that is formed based on CFET devices, in accordance with some embodiments.

FIG. 3 is schematic diagram of the AOI cell 100 that is formed based on CFET devices, in accordance with some embodiments. As shown in FIG. 3, the AOI cell 100 can be formed by a transistor group 300 that includes four CFET devices 302-308, where each of the CFET devices is coupled to a respective input. For example, the CFET device 302 is coupled to the input A, and the CFET device 304 is coupled to the input B. In addition, each of the CFET devices can include a n-type transistor and a p-type transistor. The n-type transistor and p-type transistor can have a shared gate structure. For example, the CFET device 302 includes the n-type transistor N1 and the p-type transistor P1, which are illustrated in FIG. 3. The four CFET devices 302-308 are connected by a plurality of local interconnects. For example, a local interconnect 310 can be formed to connect n-type transistors N1 and N2, and a local interconnect 312 can be formed to connect p-type transistors P1 and P2. The four CFET devices are further coupled to the supply voltage VDD, the ground voltage VSS, and the output Y through the local interconnects. The device can also include a first metal layer (e.g., M0) 314 that is configured to redistribute p-fet device signal.

Figure 4:
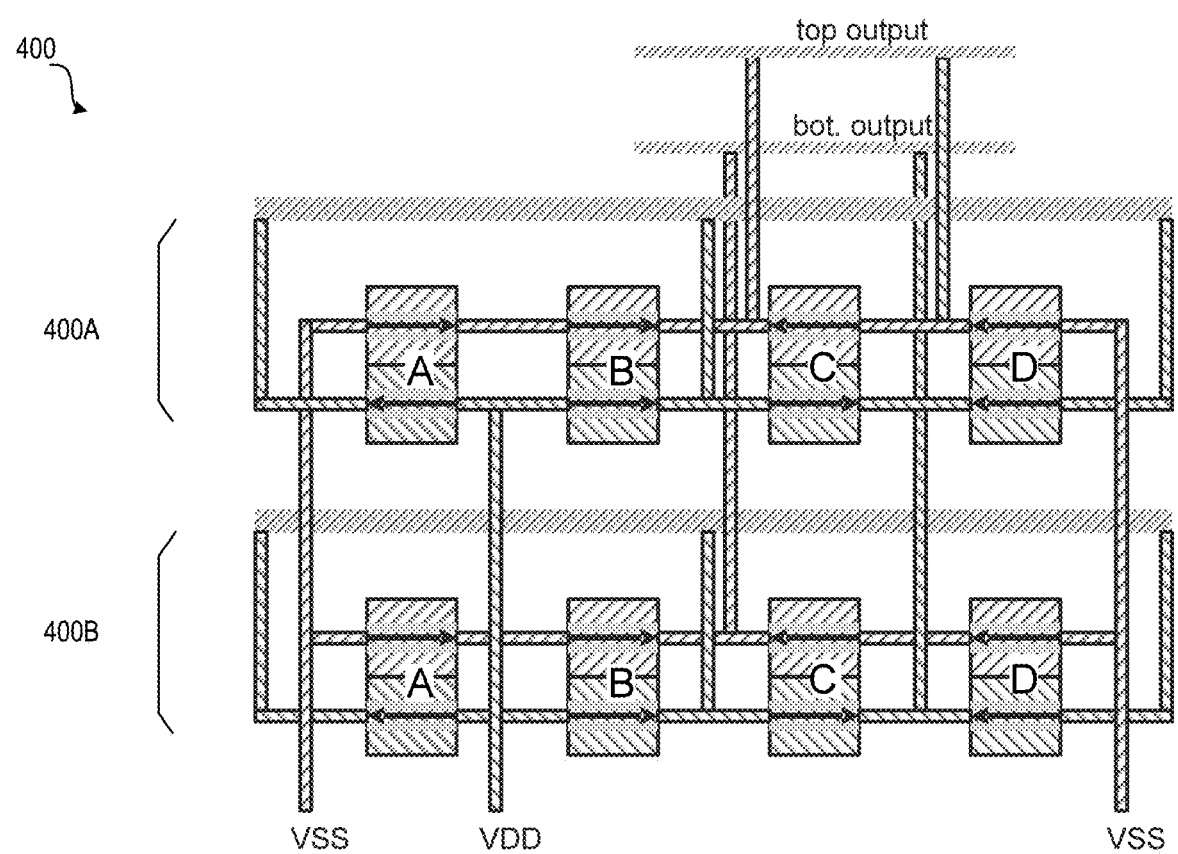
FIG. 4 is a schematic diagram of two stacked AOI22 cells that are formed based on CFET devices, in accordance with some embodiments.

One means of achieving 3D integration is to simply stack standard cells on top of each other. Various means of wafer or substrate bonding exist to accomplish the result that is shown conceptually in FIG. 4. As shown in FIG. 4, two AOI cells 100 can be formed by two CFET transistor stacks 400A and 400B respectively. The transistor stack 400A can be formed in a first wafer to provide a top output and the transistor stack 400B can be formed in a second wafer to provide a bottom output. The two wafers can then be bonded together to form a 3D integration. While minimally disruptive to the standard cell design, this 3D integration approach fails to achieve the cost or manufacturing efficiency gains that are ultimately the goal of semiconductor scaling. Either the semiconductor manufacturer incurs the cost of having to build two chips, and then having to bond them together or, if subsequent CMOS layers are manufactured sequentially, the process engineers have to solve challenging thermal budget issues associated with activating devices in the presence of metal wiring. Either way, sequential 3D integration, unlike conventional 2D integration, does not offer the efficiency gains of producing twice as many transistors with equivalent process cost or complexity (as dictated by Moore's law).

Figure 5:
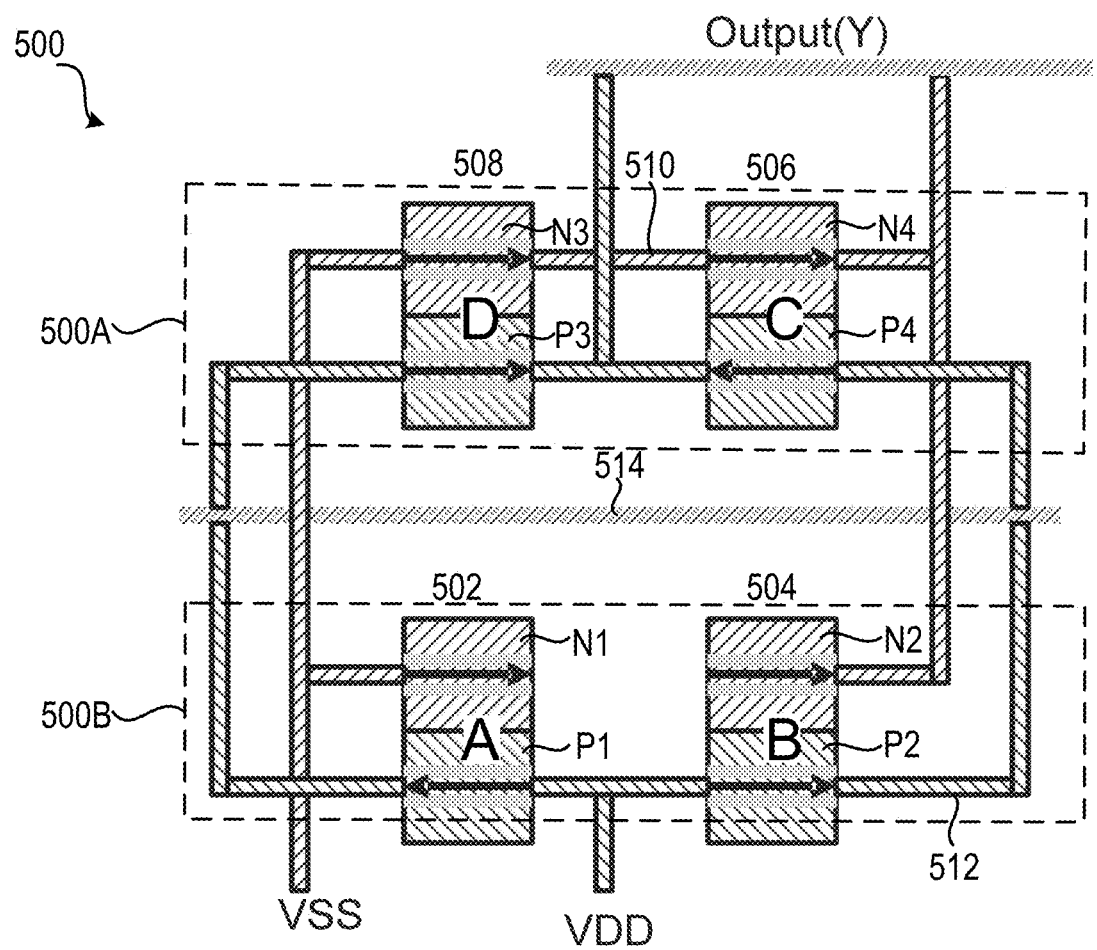
FIG. 5 is schematic diagram of an AOI22 cell that is formed by folding CFET devices, in accordance with some embodiments.

Alternatively, rather than stacking standard cells in sequential levels of CMOS, 3D integration realized by folding entire cells, not just transistors as is done in CFET, on top of each other as illustrated in FIG. 5. As shown in FIG. 5, the AOI cell 100 can be formed by a transistor stack 500. The transistor stack 500 can have four CFET devices 502-508 that are stacked into two groups 500A-500B along a direction perpendicular to a substrate. Each of the two groups can further have two CFET devices that are positioned in parallel. For example, the group 500A can have the CFET devices 506 and CFET device 508 that are positioned in parallel. Each of the CFET devices can include a n-type transistor and a p-type transistor. The n-type transistor and p-type transistor can have a shared gate structure. For example, the CFET device 502 includes the n-type transistor N1 and the p-type transistor P1. The four CFET devices 502-508 are connected through a plurality of local interconnects. For example, a local interconnect 510 is formed to connect the n-type transistors N3 and N4, and a local interconnect 512 is formed to connect the p-type transistors P2 and P4. The four CFET devices are further coupled to the supply voltage VDD, the ground voltage VSS, and the output Y through the local interconnects. In addition, a first metal layer (e.g., M0) 514 is positioned over the transistor group 500B and configured to redistribute p-fet device signal. While this approach provides certain design efficiency enhancements in that the place and route tool continues to operate in a single plane, it does not resolve the inefficiency issues associated with sequential device manufacturing as outlined above.

Figure 6:
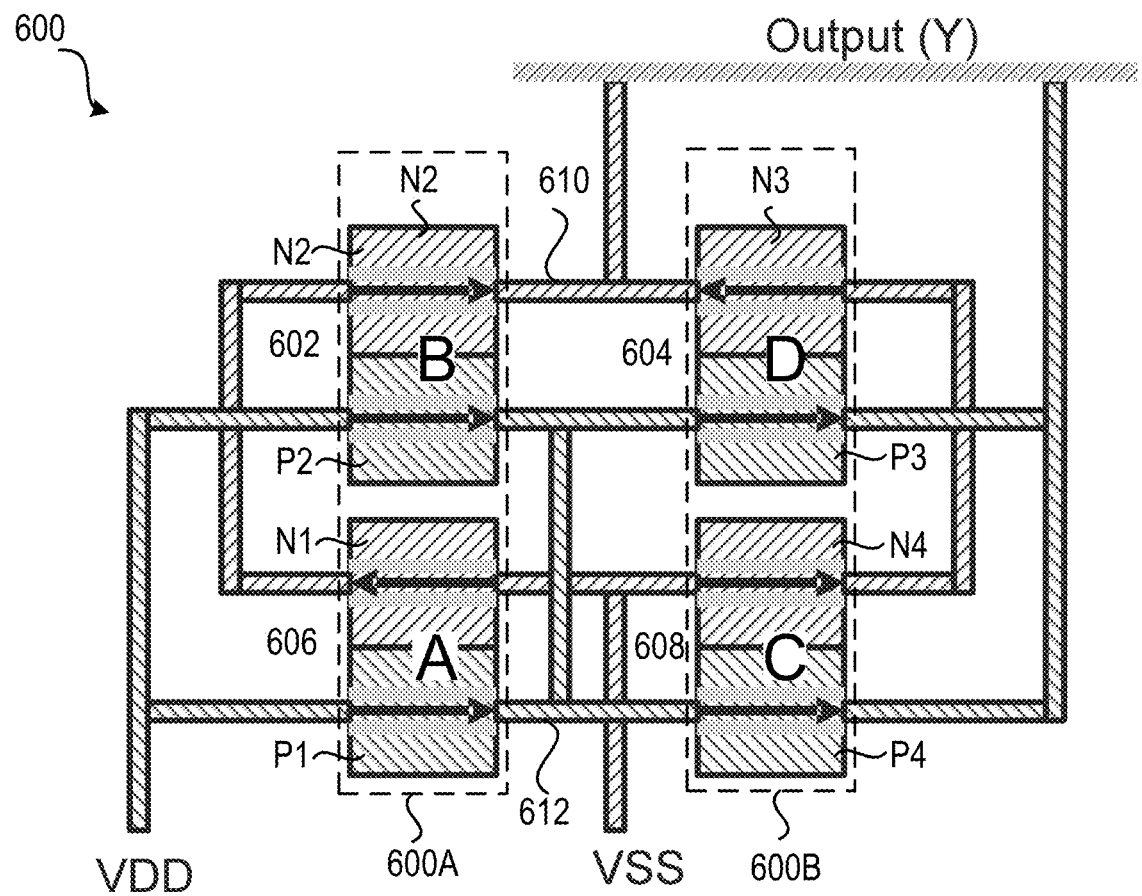
FIG. 6 is a schematic diagram of an AOI22 cell that is formed by using a first vertical routing technique, in accordance with some embodiments.

What is desired of 3D integration is monolithic integration of stacked devices, i.e. the concurrent manufacturing of multiple devices in 3D space using vertical routing as previously described by the inventors. To illustrate this desire and highlight remaining design and process complexities, FIG. 6 shows a two CFET tall stack rendering of the AOI cell 100. As shown in FIG. 6, the AOI cell 100 can be formed by a transistor stack 600 through a first vertical routing process. The transistor stack 600 can have four CFET devices 602-608 that are stacked into two groups 600A-600B in parallel. Each of the two groups can further have two CFET devices stacked over one another. For example, the group 600A can have the CFET device 602 that is stacked over the CFET device 606. Each of the CFET devices can include a n-type transistor and a p-type transistor. The n-type transistor and p-type transistor can have a shared gate structure. For example, the CFET device 602 includes the n-type transistor N2 and the p-type transistor P2. The four CFET devices 602-608 are connected through the vertical routing by a plurality of interconnects (e.g., 610 and 612). The four CFET devices are further coupled to the supply voltage VDD, the ground voltage VSS, and the output Y through the interconnects.

Figure 7:
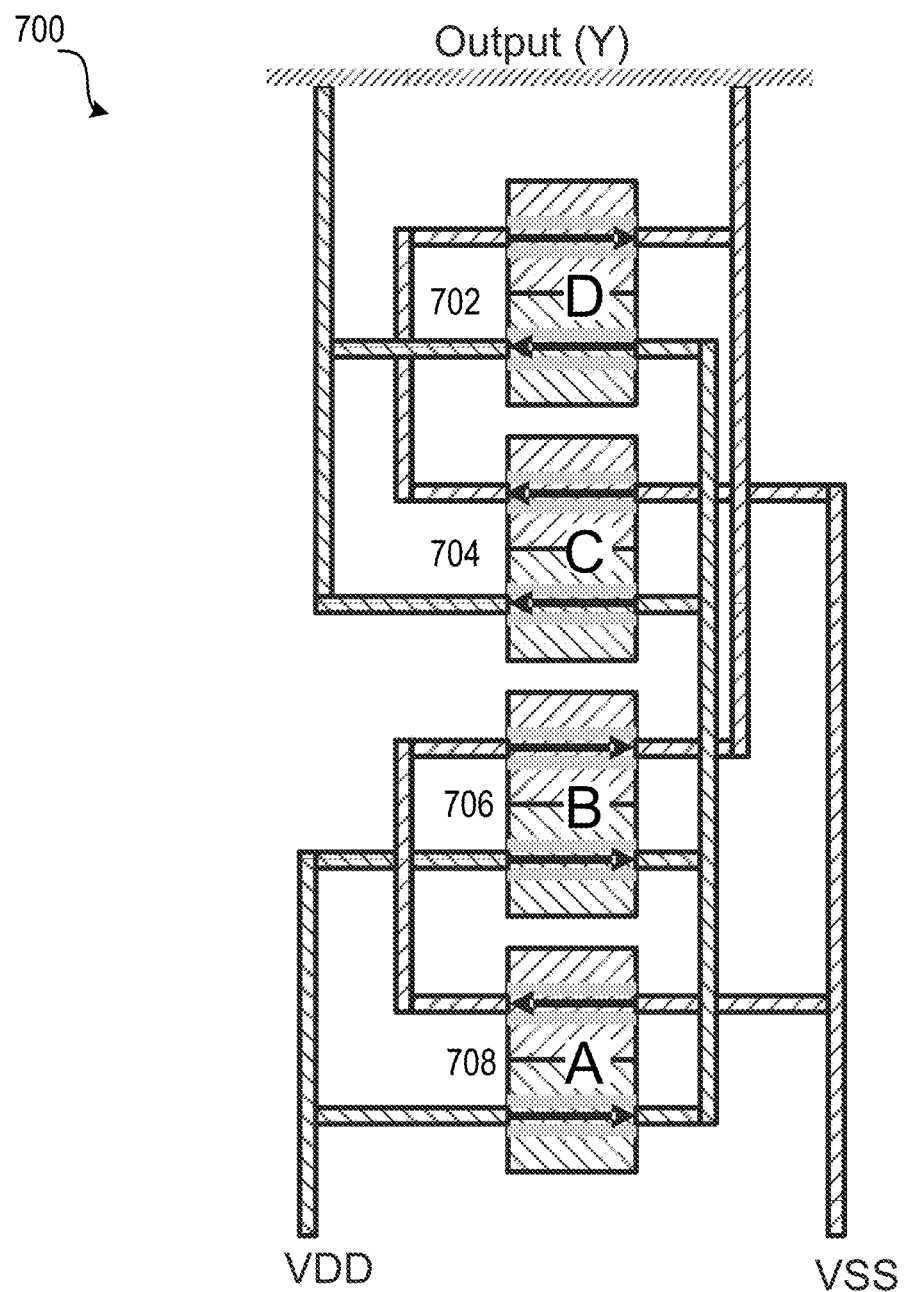
FIG. 7 is a schematic diagram of an AOI22 cell that is formed by using a second vertical routing technique, in accordance with some embodiments.

The vertical wiring technique addresses one major inefficiency in 3D integration by stacking active transistors without intermediate wiring levels, where all transistors can be patterned and manufactured concurrently. Note that two inefficiencies remain. One challenge is resolving the complex transistor-level wiring, as illustrated in FIG. 7. FIG. 7 is a schematic diagram of the AOI cell 100 that is formed by using a second vertical routing technique, in accordance with some embodiments. As shown in FIG. 7, the AOI cell 100 can implemented by a transistor stack 700. The transistor stack 700 includes four CFET devices 702-708 that are stacked in a row along a direction perpendicular to a substrate. The four CFET devices 702-708 are connected to each other through the vertical routing by a plurality of interconnects (or transistor-level wiring). In 3D space, transistor-level wiring is challenging and error prone, leading to loss of design efficiency. Another challenge is enabling each level of CMOS to have unique local interconnect and contacts. This increases mask count and manufacturing complexity to undesirable levels. At least four individual mask levels need to be uniquely defined for each floor of the CFET skyscraper (stacked structure).

Techniques herein improve design and manufacturing efficiency of monolithically integrated 3D CMOS devices. Such improvement is accomplished by implementing a technology definition and design flow that replaces existing standard cell logic flow with an architecture that consists of two unique components.

One component is a generic device stack. This generic device stack is akin to a gate array in which all CFET source (input), drain (output), and gate connections are wired to an array of contacts positioned immediately above the top CMOS level of a corresponding standard cell. This generic device stack enables an entire stack of transistors to be manufactured with a single exposure for the active channel and gate conductor in an extension of a CFET integration process previously disclosed by the inventors. The poly gates and local interconnect in this generic device stack are stair-cased using a sequence of vertical and lateral etch steps to allow unobstructed access to each layer from above. This essentially forms a stepped pyramid structure from a cross-sectional view. Vertical contacts connecting each layer in the device stack to the array of contacts are positioned directly above the top CMOS level being formed in a single patterning operation. Formation of such a structure uses etch stops engineered into each respective contacts target layer. This generic device stack is configured with functional differentiation. Accordingly, a volume of transistors is efficiently built connected to an array of pegboard style contacts.

Another component is a series of customization layers in which local wiring is used to connect the particular contacts to achieve desired cell functionality. Accordingly, a generic or repeatable pegboard design of a device stack can be used to create any of many types of logic devices. While the specific embodiments described herein focus on logic designs using stacked CFET transistors, it will be readily apparent to those skilled in the art how these techniques and device structures are applicable to memory cells and other transistor types.

In one embodiment, techniques herein provide an architecture definition that enables efficient 3D monolithic integration by separating the established standard cell design flow into: (a) a volume of transistors with connections to an array of pegboard style contacts sitting just above the top CMOS level, which can be shown in FIGS. 8A and 8B; and (b) a series of wring levels that provide the desired functionality by connecting the appropriate input (source), output (drain), and signal (gate contact) contact levels, which can be shown in FIG. 8C.

Figure 8A:
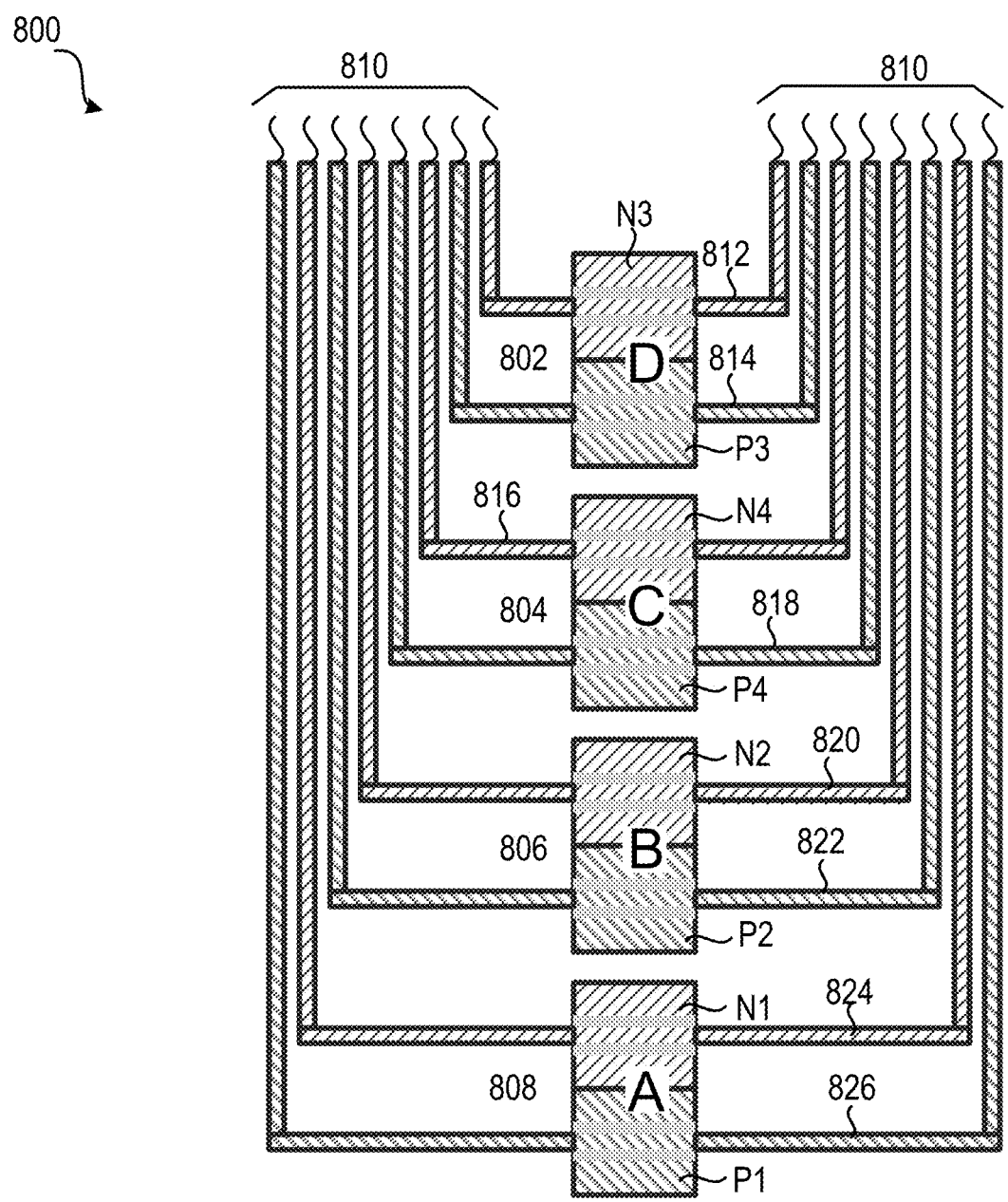
FIG. 8A is schematic diagram of an AOI22 cell that is formed based on a 3D integrated CFET stack with stair-cased local interconnects, in accordance with some embodiments.

FIG. 8A is schematic diagram of the AOI cell 100 that is formed based on a 3D integrated CFET stack with staircased local interconnects. As can be seen in FIG. 8A, a stepped or pyramidal transistor stack 800 is formed with vertical contacts 810 extending from steps of the transistor stack 800. The transistor stack 800 can include four CFET devices 802-808 that are stacked over a substrate. Each of the CFET devices can include a n-type transistor and p-type transistor that are coupled to a respective input. For example, the CFET 802 can include the n-type transistor N3 and a p-type transistor P3 that are coupled to the input D. The transistor stack 800 can have a plurality of local interconnects 812-826 that have a staircase configuration. Each of the local interconnects is coupled to a respective transistor. The transistor stack 800 can further include a set of array of vertical contacts 810 that are coupled to and extend from the local interconnects 812-826. The set of array of vertical contacts 810 can have top surfaces in-plane with each other, while length of each vertical contact or column is different depending on a height and location of a landing step.

Figure 8B:
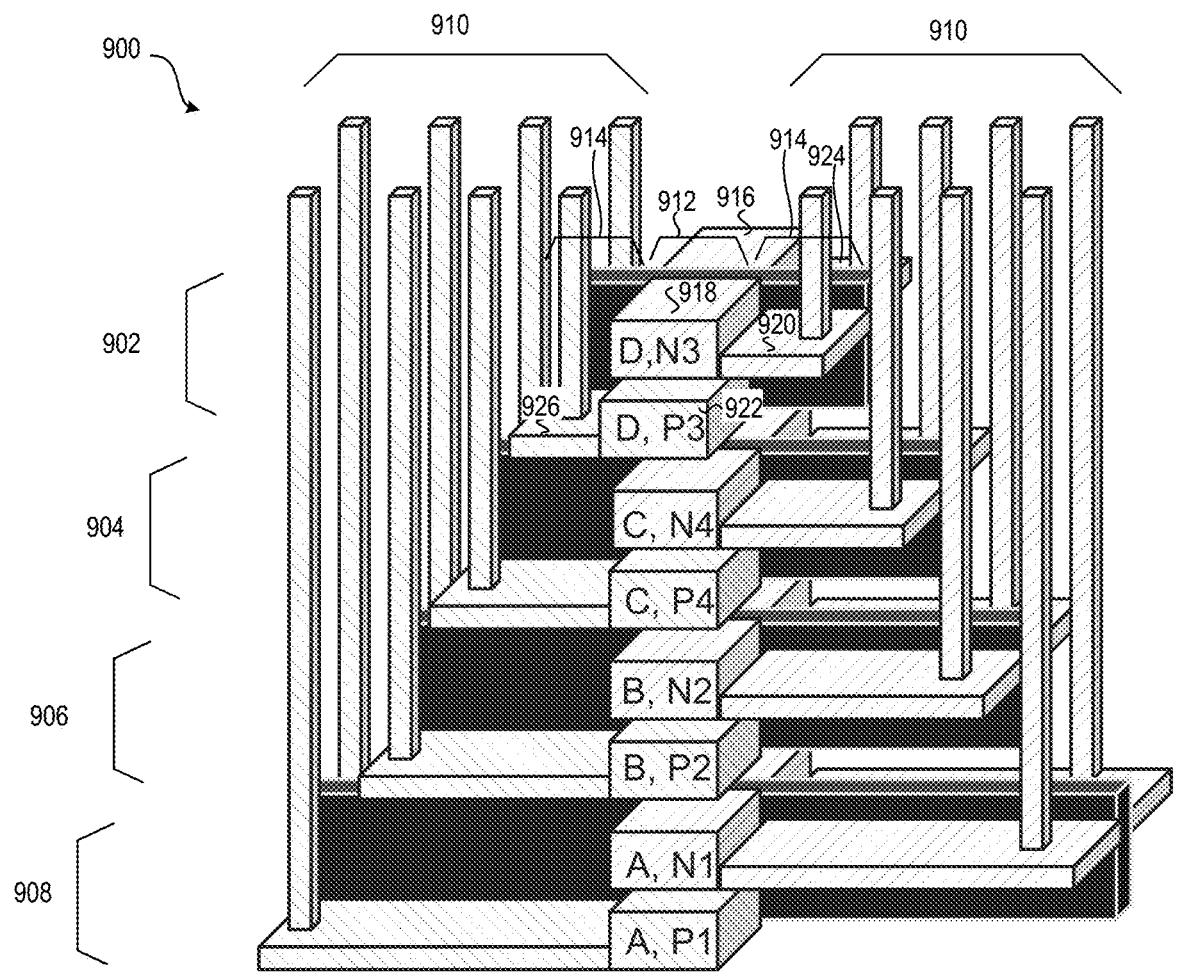
FIG. 8B is schematic view of an AOI22 cell that is formed based on a 3D integrated CFET stack with stair-cased local interconnects, in accordance with some embodiments.

FIG. 8B is a schematic view of the AOI cell 100 that is formed based on a 3D integrated transistor stack 900. The transistor stack 900 can includes four CFET devices 902-908 that are stacked over a substrate (not shown). Each of the four CFET devices can include a transistor pair that is formed by a n-type transistor and a p-type transistor. For example, the CFET device 902 can include a transistor pair that is formed by the n-type transistor N3 and the p-type transistor P3, which are coupled to the input D. The n-type transistor and the p-type transistor can have a shared gate structure. The n-type transistor can be positioned over the p-type transistor. The gate structure can surround a n-type channel region of the n-type transistor and a p-type channel region of the p-type transistor. The channel region can have a sheet, wire or bar configuration. The n-type transistor can have a source region and a drain region that are position at two ends of the n-type channel region respectively, where the gate structure surrounds the n-type channel region, and positioned between the source region and the drain region of the n-type transistor. The p-type transistor can have a source region and a drain region that are positioned at two ends of the p-type channel region respectively, where the gate structure surrounds the p-type channel region, and positioned between the source region and the drain region of the p-type transistor. Moreover, the gate structure can be electrically coupled to a gate electrode. The source region and the drain region can have a source local interconnect and a drain local interconnect respectively.

As shown in FIG. 8B, the gate electrodes and the source/drain (S/D) local interconnects have a staircase configuration. Further, a plurality of vertical contacts 910 are coupled to and extend from the S/D local interconnects or the gate electrodes. Therefore, the staircase configuration of the gate electrodes and the S/D local interconnects provides an easy access to each transistor in the transistor stack 900, and avoids a complicated interconnect connection that are illustrated in FIGS. 3-7.

Still referring to FIG. 8B, the n-type transistor N3 and the p-type transistor P3 have a shared gate structure 912. The n-type transistor N3 has a source region 918 and a drain region 916 that are position at two ends of the n-type channel region. The n-channel region is surrounded by the gate structure 912, where the gate structure 912 is positioned between the source region 918 and the drain region 916. The p-type transistor P3 has a source region 922 and a drain region behind the gate structure 912. The source region 922 and the drain region are positioned at two ends of the p-type channel region. Similarly, the p-type channel region is surrounded by the gate structure 912, where the gate structure 912 is positioned between the source region 922 and the drain region of the p-type transistor P3.

The gate structure 912 can have one or more gate electrodes 914. The gate electrodes 914 can be positioned at two ends of the gate structure 912. The source region 918 and the drain region 916 of the n-type transistor N3 can have a source local interconnect 920 and a drain local interconnect 924 respectively. Similarly, the source region 922 of the p-type transistor P3 can have a source local interconnect 926, and the drain region of the p-type transistor P3 can have a drain local interconnect positioned behind the gate electrodes 912.

It should be noted that FIG. 8B is merely an example. The transistor stack 900 can have any number of CFET devices that are stacked over the substrate (not shown). The CFET devices can be spaced apart from one another by a plurality of dielectric layers which is not shown. The CFET device can have a n-type transistor and a p-type transistor. In some embodiments, the n-type transistor can be positioned over the p-type transistor. In some embodiment, the p-type transistor can be positioned over the n-type transistor. In addition, the n-type transistor and the p-type transistor can be separated by an insulating layer. Further, it should be noted that the source region and the gate structure are separated by an insulating layer, and the drain region and the gate structure are also separated by an insulating layer.

Figure 8D:
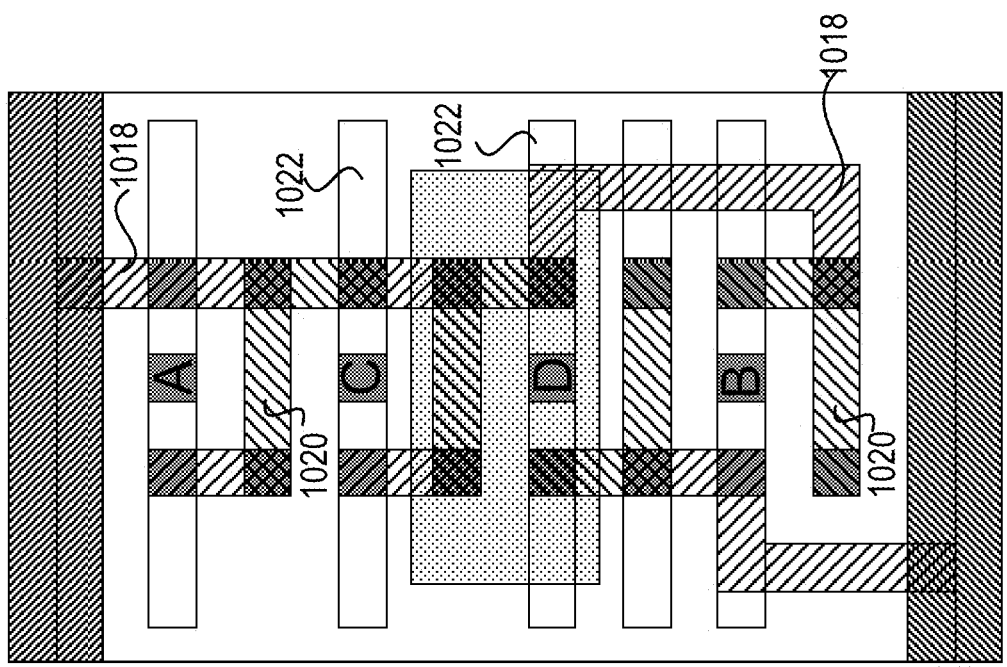
FIG. 8D is a second top down layout view of an AOI22 cell that is formed based on a 3D integrated CFET stack with stair-cased local interconnects, in accordance with some embodiments.
Figure 8C:
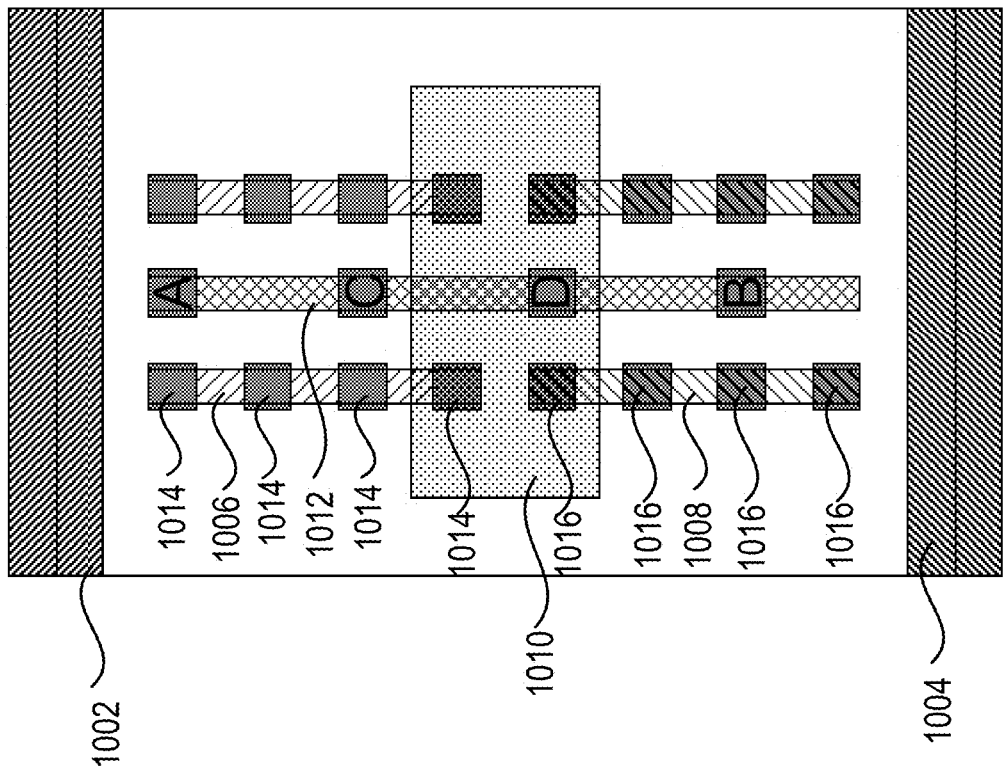
FIG. 8C is a first top down layout view of an AOI22 cell that is formed based on a 3D integrated CFET stack with stair-cased local interconnects, in accordance with some embodiments.

FIGS. 8C and 8D are top down layout views of the AOI cell 100 that is formed based on a 3D integrated CFET stack with stair-cased local interconnects. FIGS. 8C and 8D illustrate a series of wring levels that provide the desired functionality by connecting the appropriate input (source), output (drain), and signal (gate contact) contact levels. FIG. 8C is a layout of generic monolithic device, and FIG. 8D shows a customization layer. As shown in FIG. 8C, the layout 1000 can have four gate electrodes A-D that is couple to inputs A-D respectively. The layout 1000 can have a VDD 1002 and a VSS 1004. The layout 1000 can have a p-fet local interconnect 1006 and a n-fet local interconnect 1008. The local interconnects 1006 and 1008 are coupled to an active device region 1010 through a n-fet source/drain contact 1014 and a p-fet source/drain contacts 1016 respectively. The layout 1000 also has a poly conductor 1012 that are coupled to the gate contacts A-D. As shown in FIG. 8D, three metal layers (wiring levels) M0 1018, M1 1020, and M2 1022 are formed that are configured to provide the desired functionality by connecting the appropriate input (source), output (drain), and signal (gate contact) contact levels.

Figure 9C:
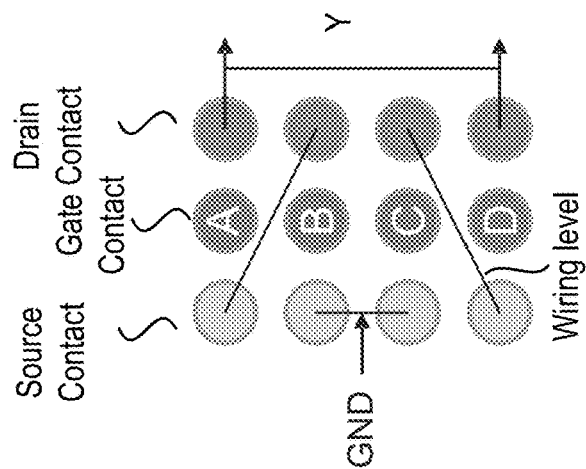
FIG. 9C is a second schematic diagram of a pegboard pattern of contacts for implementation of logic functions of an AOI 22 cell, in accordance with some embodiments.
Figure 9B:
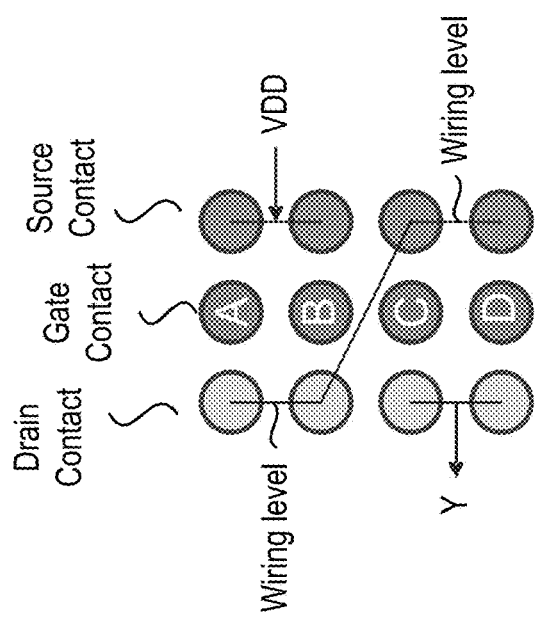
FIG. 9B is a first schematic diagram of a pegboard pattern of contacts for implementation of logic functions of an AOI 22 cell, in accordance with some embodiments.
Figure 9A:
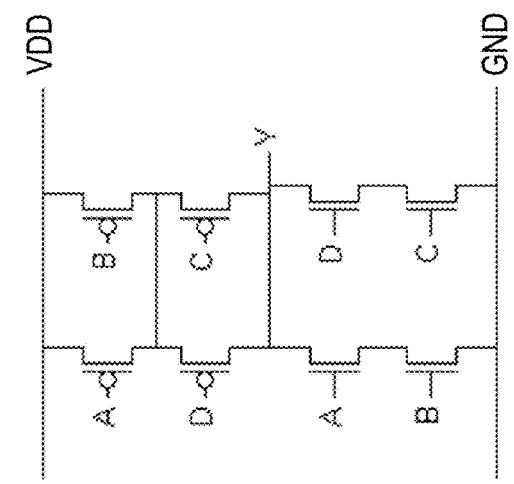
FIG. 9A is a schematic circuit diagram of an And-Or-Invert 22 (AOI22) cell, in accordance with some embodiments.

In another embodiment, techniques herein provide a repeating 3D transistor and contacts access that is uniform and customizable. Such a design essentially provides a "pegboard" pattern of contacts for implementation of 3D logic. Schematics can then be mapped to 3D logic designs as illustrated for a standard logic AOI function in FIGS. 9A-9C. FIG. 9A is a schematic circuit diagram of the AOI cell 100. FIG. 9B is a pegboard pattern of contacts formed in p-fet side of the AOI cell 100. FIG. 9C is a pegboard pattern of contacts formed in n-fet side of the AOI cell 100. As shown in FIGS. 9B and 9C, the standard logic AOI function can be formed by connect corresponding source/drain contacts and gate contacts through a series of wiring level (e.g., M0, M1, M2). In some embodiments, the pegboard pattern of contacts can be formed based on the vertical contacts 910 that are illustrated in FIG. 8B. The vertical contacts 910 can be coupled to the gate electrode, the S/D local contacts so as to form the pegboard" pattern of contacts. The standard logic AOI function can be fulfilled by making corresponding connections between the vertical contacts 910, the supply voltage VDD, the inputs A-D, and the ground voltage GND through a series of wiring levels (e.g., M0, M1, M2) that are positioned over the array of vertical contacts and provide a functionality of the semiconductor device by connecting the array of vertical contacts.

It should be noted that some logic functions, like the AOI22, neatly consume the four CFET devices used in this example, while others, like a simple inverter, require fewer transistor pairs. With techniques herein, because the contacts connect to a generic volume of transistors, a given/corresponding peg assignment is irrelevant. Therefore, the 'A' and 'B' pegs used in FIGS. 9A-9C to design a buffer can easily be ported to the 'B' and 'C' pegs left available in the design of an inverter. The simplicity and clarity of this technique enables product implementation through extensions to existing electronic design automation tools and flows.

Techniques herein provide a monolithic 3D integration flow that enables a stack of m CFET devices (in the present disclosure, m is equal to four) to be built in a series of layered depositions. Then these device layers are uncovered or exposed thereby providing access from above by sequentially recessing layers in a pyramid-type formation technique. Once formed in this manner, all device layers can be contacted by an array of vertical interconnects patterned in a single exposure and etched to the appropriate depth by incorporating corresponding etch stops.

Figure 10:
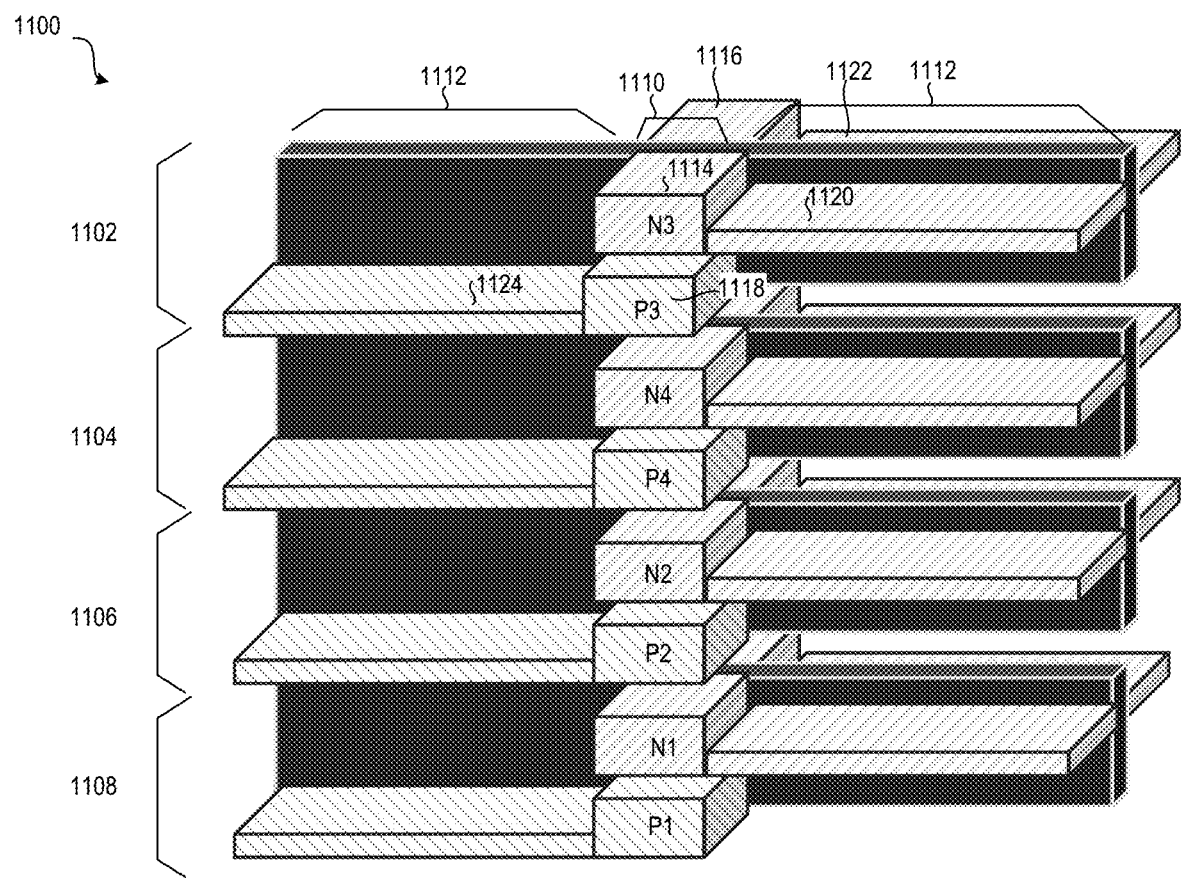
FIGS. 10-15 are schematic views of various exemplary intermediate steps of manufacturing an AOI22 cell that is formed based on a 3D integrated CFET stack with stair-cased local interconnects, in accordance with some embodiments.

The monolithic 3D integration flow can be illustrated by FIGS. 10-15. As shown in FIG. 10, a transistor stack 1100 can be formed over a substrate (not shown). The transistor stack 1100 has a similar configuration to the transistor stack 900 that is illustrated in FIG. 8B. As shown in FIG. 10, the transistor stack 1100 can have a plurality of CFET devices 1102-1108 that are stacked over the substrate. Each of the CFET devices can have a n-type transistor and a p-type transistor that are stacked over one another. In some embodiments, the n-type transistor is positioned over the p-type transistor. In some embodiments, the p-type transistor is positioned over the n-type transistor. In an example of FIG. 10, the n-type transistor is positioned over the p-type transistor.

The transistor stack 1100 can have a plurality of gate electrodes that are stacked over the substrate and electrically coupled to gate structures of the plurality of CFET devices. For example, the CFET device 1102 can have a gate structure 1110 that is shared by a n-type transistor N3 and a p-type transistor P3. The gate structure 1110 can have a gate electrode 1112 that are positioned at two ends of the gate structure. The transistor stack 1100 can have a plurality of source/drain (S/D) local interconnects that are stacked over the substrate and electrically coupled to source regions and drain regions of the CFET devices. For example, the n-type transistor N3 can have a source region 1114 and a drain region 1116. The source region 1114 can have a source local interconnect 1120 and the drain region 1116 can have a drain local interconnect 1122. Similarly, the p-type transistor P3 can have a source region 1118 and a drain region positioned behind the gate structure 1110. The source region 1118 has a source local interconnect 1124, and the drain region has a drain local interconnect positioned behind the gate electrode 1112.

Figure 11:
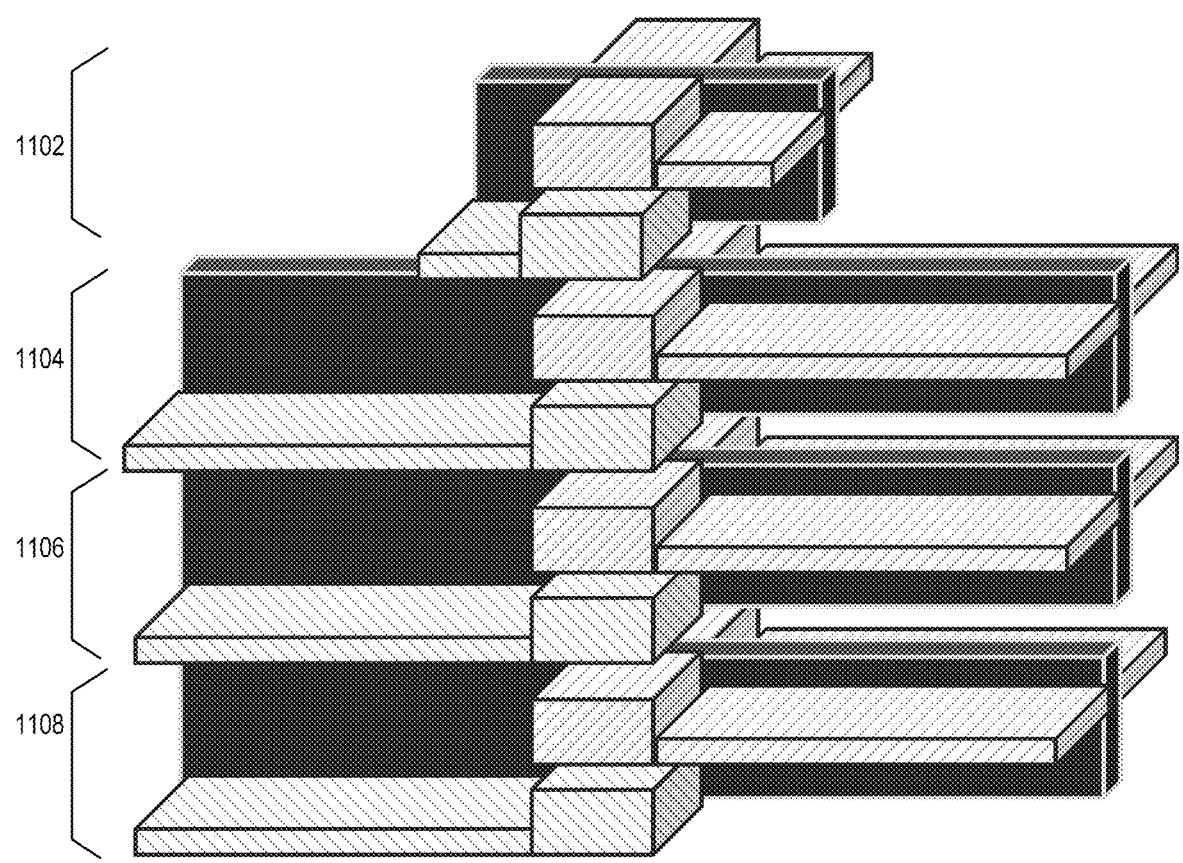
Figure 12:
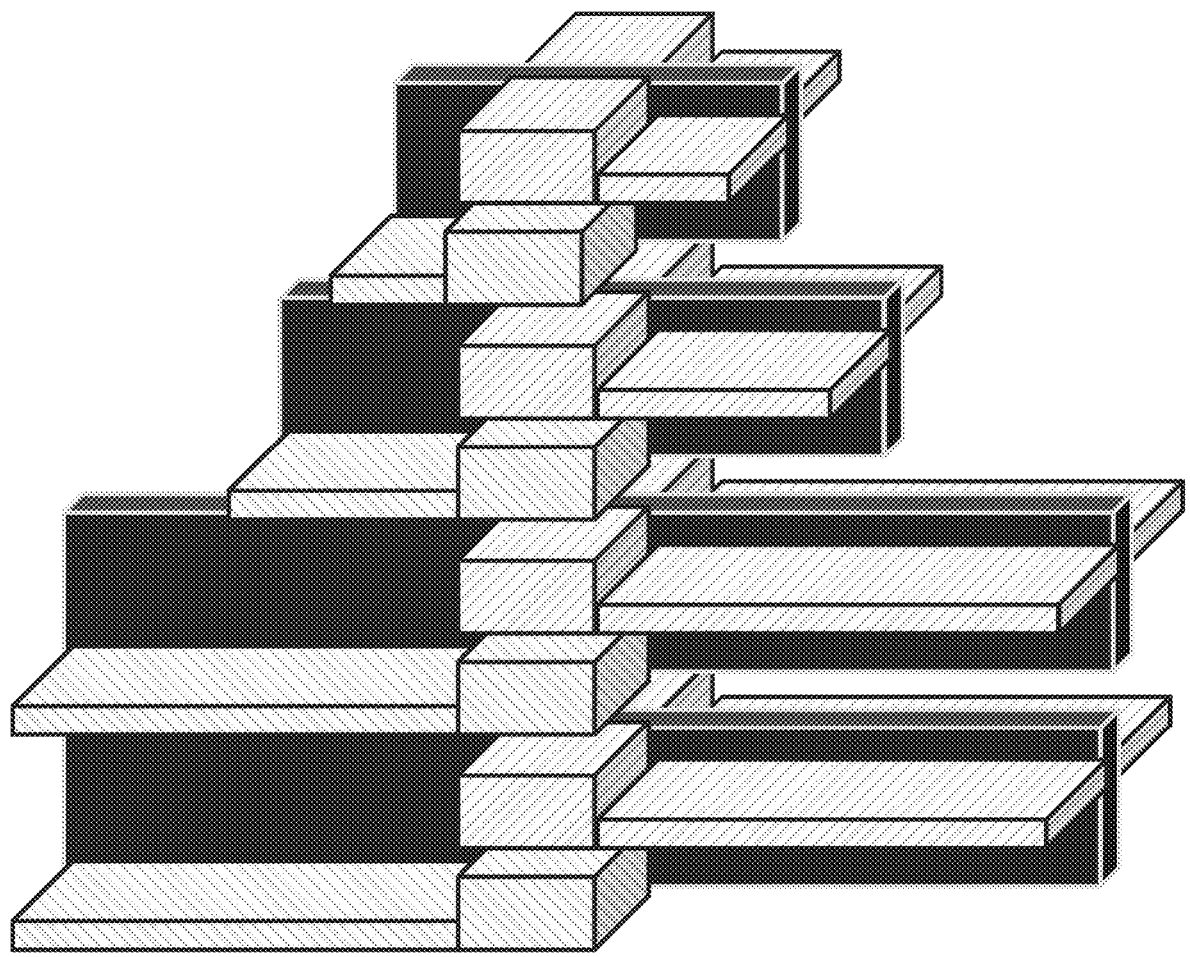
Figure 13:
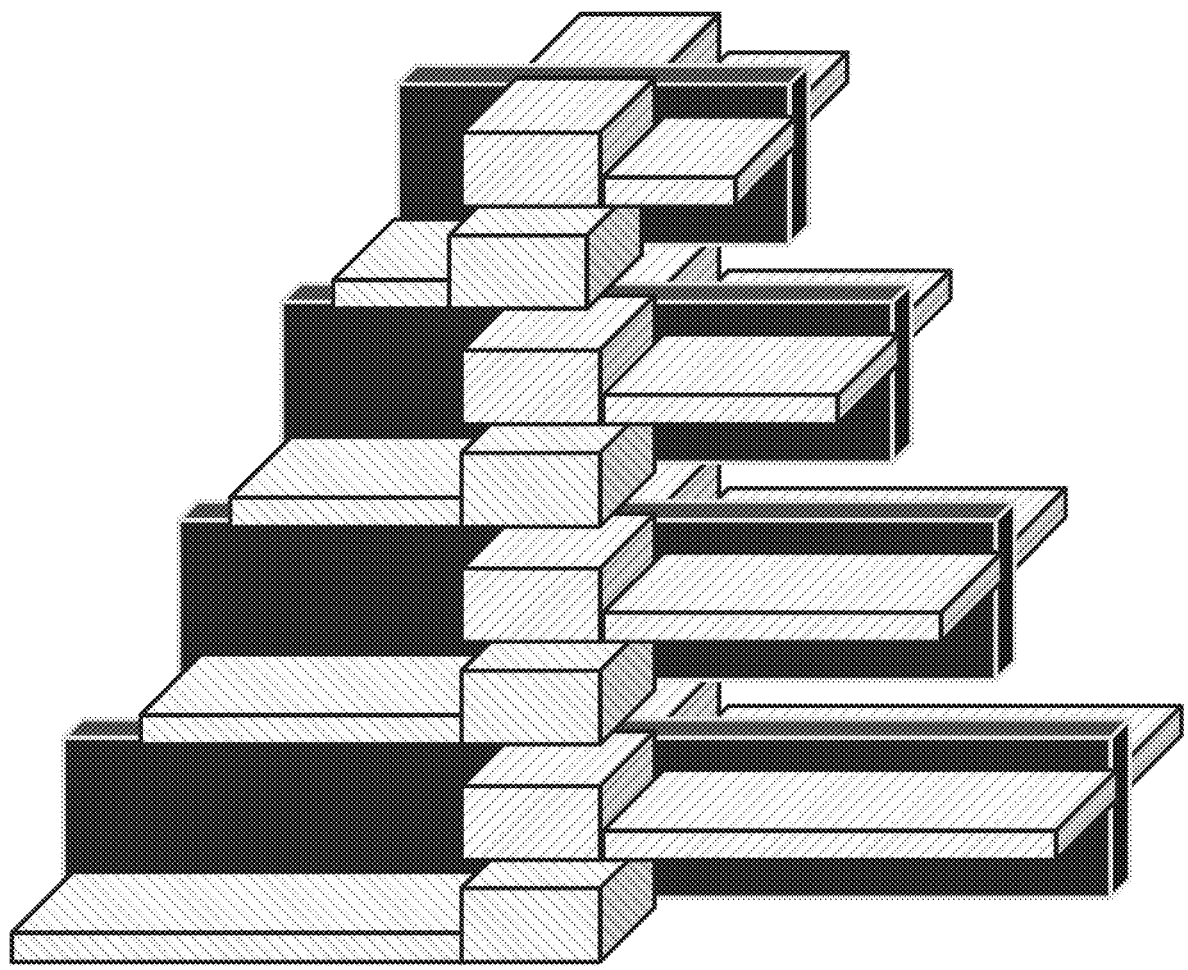

In FIGS. 11-13, a sequence of vertical and lateral etch steps can be performed to etch the plurality of the gate electrodes and the plurality of S/D local interconnects in the transistor stack 1100 so that the plurality of the gate electrodes and the plurality of S/D local interconnects have a staircase configuration. For example, in FIG. 11, portions of the gate electrode and S/D local interconnects of the CFET device 1102 are removed. In FIG. 12, portions of the gate electrode and S/D local interconnects of the CFET device 1104 are removed. Based on such a sequential etching process, a staircase configuration can be formed in the gate electrodes and the S/D local interconnects. It should be noted that during the vertical and lateral etch steps, a photolithography process can be applied. The photolithography process can provide a mask layer that protects a desired region and exposed a region that needs to be removed. The exposed region can be removed subsequently by the etch steps.

Figure 14:
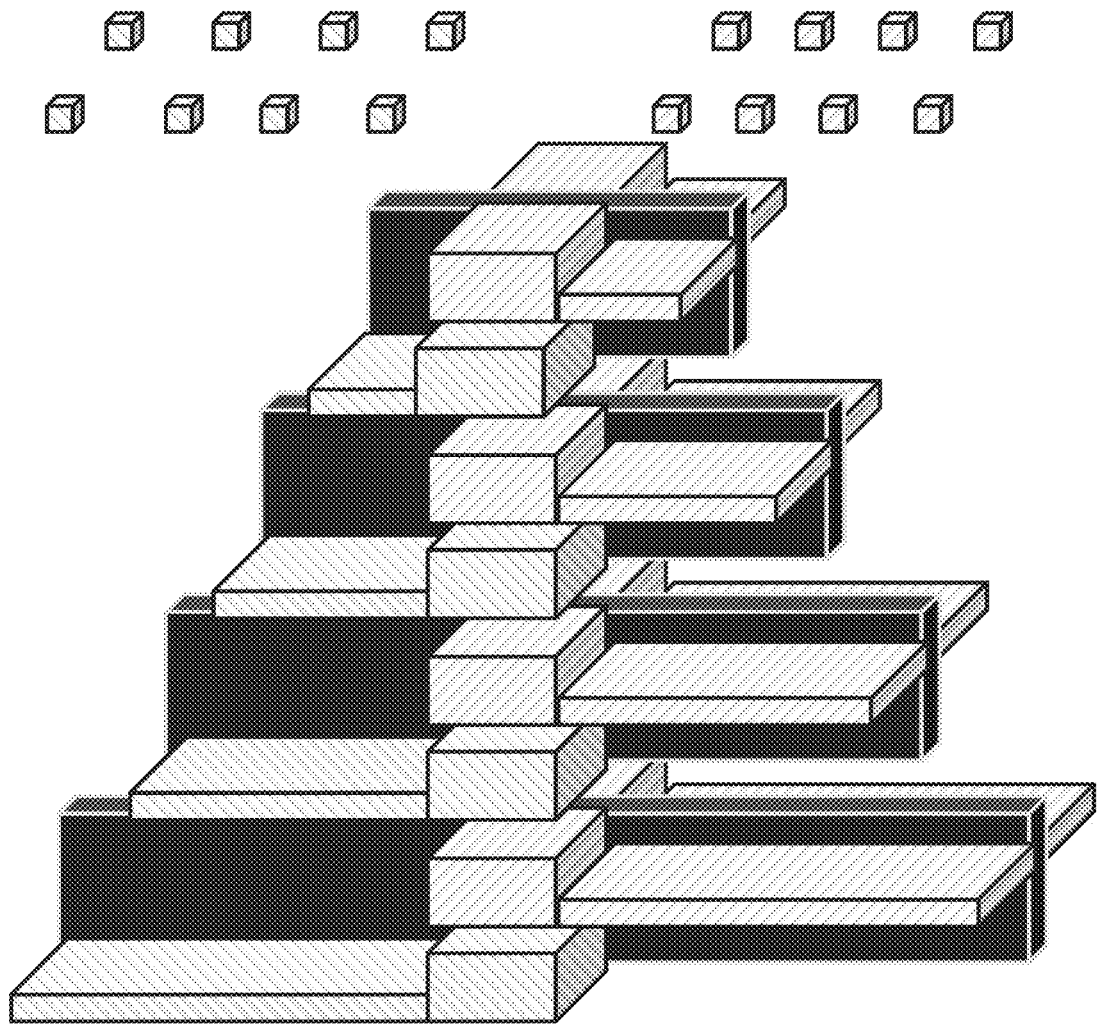

In FIG. 14, a plurality of vertical contacts can be formed in a dielectric stack (not shown). The vertical contacts can be formed based on a patterning process and deposition process. The patterning process can include a photolithography process that forms a plurality of patterns in a mask layer. The etching process can subsequently transfer the pattern into the dielectric stack to form a plurality of contact openings. The deposition process can be applied to deposit a conductive material into the contact openings to form the vertical contacts. The deposition process can include chemical vapor deposition (CVD), physical vapor deposition (PVD), diffusion, atomic layer deposition (ALD), or other suitable deposition processes. The conductive material can include tungsten, cobalt, ruthenium, copper, aluminum, or other suitable conductive materials.

Figure 15:
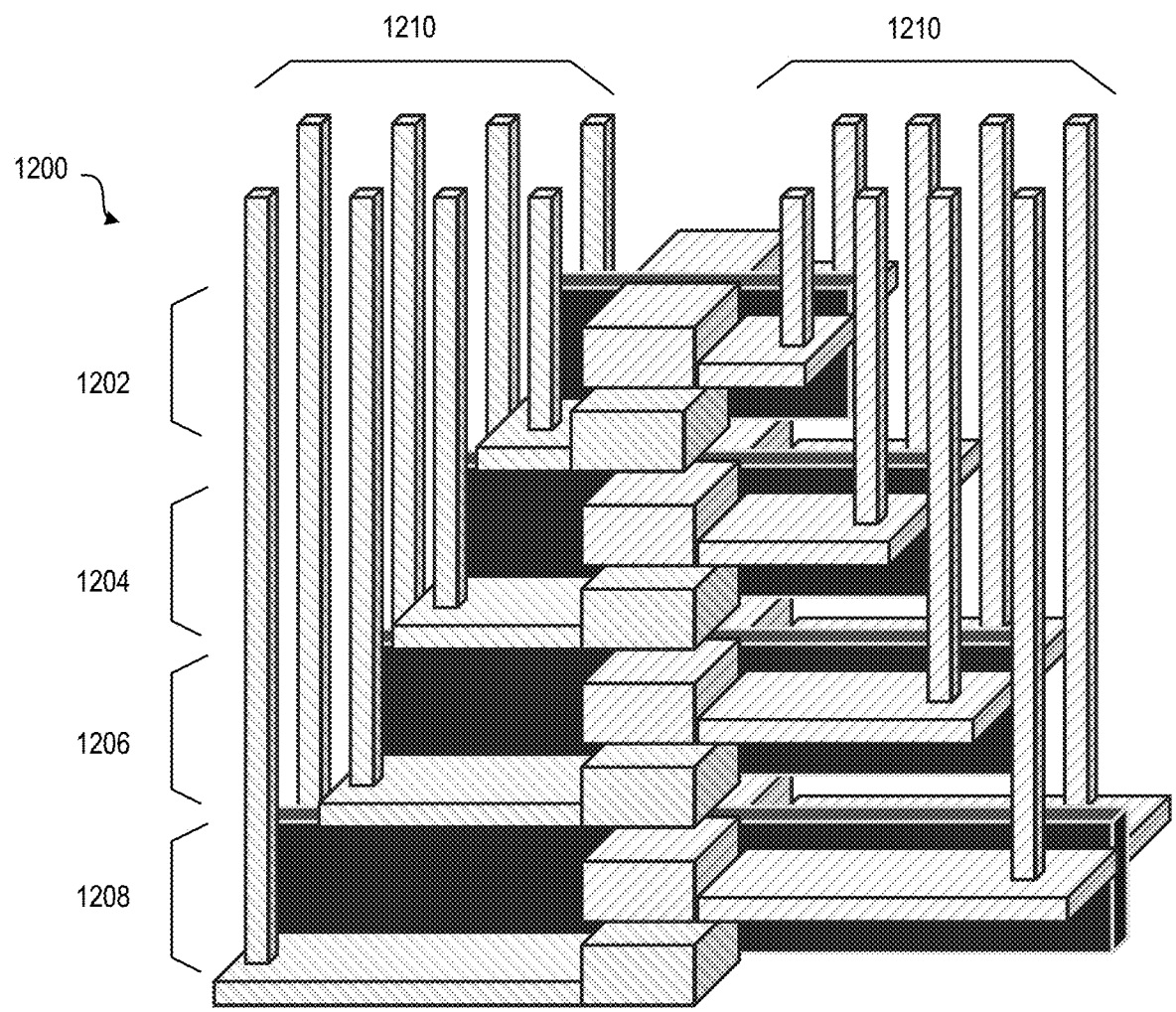

In FIG. 15, after the deposition of the conductive material, the AOI cell 100 can be formed based on a 3D integrated CFET stack 1200 with stair-cased local interconnects. The CFET stack 1200 can have a similar configuration to the CFET transistor stack 900. For example, the CFET stack 1200 includes four CFET devices 1202-1208 that are stacked over the substrate. The gate electrodes and the S/D local interconnects of the CFET stack 1200 have a staircase configuration. A plurality of vertical contacts 1210 are coupled to and extended from the gate electrodes and the S/D local interconnects.

Technology architectures herein enable efficient 3D monolithic integration of stacked transistors for logic and memory designs. This includes building a stack of generic transistors (uniform base transistor design) using sequential deposition and etch operations on a single set of lithographically defined patterns. Gate electrodes and source/drain local interconnects of this generic stack of transistors form a stair-cased (stepped pyramidal) structure providing subsequent transistor levels to access from above. An array of contacts is etched from a plane above a top device layer to land on each respective transistor level of said stair-cased structure. The array of contacts can have a uniform top surface. Sets of the generic transistors are then connected according to a predetermined logic function design or memory design. A pattern of connecting the array of contacts then defines a logic or memory function of the generic transistor. In other words, all transistors on a substrate can have a same base architecture with an array of vertical contacts providing a customizable function by wiring pattern. Note that in some configurations, more than one logic function can be wired to a given pegboard. With simple logic functions, only a portions of contacts and corresponding transistors may be used. This leaves open contacts for wiring a second logic function on a same generic device stack.

Note that example embodiments herein focus on 3D logic structures, but one skilled in the art can appreciate how techniques herein can be applied to 3D memory structures such as stacked SRAM. In the present disclosure, the AOI cell is merely an example. The disclosed stair-cased interconnect structure can be applied to other logic structures, analog structures, memory structures, or other semiconductor devices.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
   a plurality of transistor pairs that are stacked over a substrate, each of the plurality of transistor pairs including a n-type transistor and a p-type transistor that are stacked over one another;
   a plurality of gate electrodes that are stacked over the substrate with a staircase configuration, the plurality of gate electrodes being electrically coupled to gate structures of the plurality of transistor pairs;
   a plurality of source/drain (S/D) local interconnects that are stacked over the substrate and extend in a first direction parallel to the substrate with a staircase configuration, the plurality of S/D local interconnects being electrically coupled to source regions and drain regions of the plurality of transistor pairs; and
   an array of vertical contacts that extend from the plurality of gate electrodes and the plurality of S/D local interconnects in a second direction perpendicular to the substrate.

2. The device of claim 1, wherein the n-type transistor is positioned over the p-type transistor so as to form a complementary field effect transistor (CFET) device.

3. The device of claim 1, wherein the p-type transistor is positioned over the n-type transistor so as to form a complementary field effect transistor device.

4. The device of claim 1, wherein:
   the array of vertical contacts are electrically coupled to the plurality of gate electrodes, and the plurality of S/D local interconnects.

5. The device of claim 4, further comprising:
   a series of wiring levels that are positioned over the array of vertical contacts and provide a functionality of the semiconductor device by connecting the array of vertical contacts.

6. The device of claim 1, wherein the n-type transistor and the p-type transistor share a gate structure that is electrically coupled to one of the plurality of gate electrodes.

7. The device of claim 6, wherein the n-type transistor has a source region and a drain region that are positioned at two ends of a n-type channel region that is surrounded by the gate structure, the n-type channel region, the source region and the drain region of the n-type transistor being arranged in the first direction.

8. The device of claim 6, wherein the p-type transistor has a source region and a drain region that are positioned at two ends of a p-type channel region that is surrounded by the gate structure, the p-type channel region, the source region and the drain region of the p-type transistor being arranged in the first direction.

9. The device of claim 1, wherein each of the plurality of S/D local interconnects is positioned at two sides of a respective gate electrode of the plurality of gate electrodes.

10. A semiconductor device, comprising:
    a plurality of transistor pairs that are stacked over a substrate, wherein the plurality of transistor pairs have a plurality of gate electrodes that are stacked over the substrate with a staircase configuration and electrically coupled to gate structures of the plurality of transistor pairs, and a plurality of source/drain (S/D) local interconnects that are stacked over the substrate with a staircase configuration and electrically coupled to source regions and drain regions of the plurality of transistor pairs;
    an array of vertical contacts that are positioned over the plurality of transistor pairs, arranged in a direction perpendicular to the substrate and electrically coupled to the plurality of gate electrodes, and the plurality of S/D local interconnects; and
    a series of wiring levels that are positioned over the array of vertical contacts and provide a functionality of the semiconductor device by connecting the array of vertical contacts.

11. The device of claim 10, wherein each of the plurality of transistor pairs comprises a n-type transistor and a p-type transistor that are stacked over one another, the n-type transistor and the p-type transistor sharing a gate structure.

12. The device of claim 11, wherein the n-type transistor is positioned over the p-type transistor so as to form a complementary field effect transistor device.

13. The device of claim 11, wherein the p-type transistor is positioned over the n-type transistor so as to form a complementary field effect transistor device.

* * * * *